(12) United States Patent
Decoutere

(10) Patent No.: US 9,425,281 B2
(45) Date of Patent: Aug. 23, 2016

(54) ENHANCEMENT MODE III-NITRIDE DEVICE AND METHOD FOR MANUFACTURING THEREOF

(71) Applicant: IMEC, Leuven (BE)

(72) Inventor: Stefaan Decoutere, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/701,313

(22) Filed: Apr. 30, 2015

(65) Prior Publication Data

US 2015/0318374 A1 Nov. 5, 2015

Related U.S. Application Data

(62) Division of application No. 13/706,133, filed on Dec. 5, 2012, now abandoned.

(60) Provisional application No. 61/569,078, filed on Dec. 9, 2011.

(51) Int. Cl.
| | |
|---|---|
| *H01L 29/66* | (2006.01) |
| *H01L 29/205* | (2006.01) |
| *H01L 23/29* | (2006.01) |
| *H01L 21/56* | (2006.01) |
| *H01L 21/02* | (2006.01) |
| *H01L 29/778* | (2006.01) |
| *H01L 29/20* | (2006.01) |

(52) U.S. Cl.
CPC ...... *H01L 29/66462* (2013.01); *H01L 21/0217* (2013.01); *H01L 21/02271* (2013.01); *H01L 21/56* (2013.01); *H01L 23/291* (2013.01); *H01L 29/2003* (2013.01); *H01L 29/205* (2013.01); *H01L 29/778* (2013.01); *H01L 29/7787* (2013.01); *H01L 2924/0002* (2013.01)

(58) Field of Classification Search
CPC ............ H01L 29/66462; H01L 29/778; H01L 29/2003; H01L 29/7781; H01L 29/7782; H01L 29/7786; H01L 29/66431; H01L 2924/13064
USPC .................................................. 257/176, 194
See application file for complete search history.

(56) References Cited

U.S. PATENT DOCUMENTS

| | | | |
|---|---|---|---|
| 2008/0124851 A1* | 5/2008 | Zhang et al. .................. | 438/172 |
| 2008/0296618 A1* | 12/2008 | Suh et al. ...................... | 257/190 |
| 2009/0072272 A1* | 3/2009 | Suh et al. ...................... | 257/194 |
| 2009/0146185 A1* | 6/2009 | Suh et al. ...................... | 257/194 |
| 2010/0087028 A1 | 4/2010 | Porthouse et al. | |
| 2010/0176421 A1* | 7/2010 | Van Hove et al. ............ | 257/194 |

* cited by examiner

*Primary Examiner* — Selim Ahmed

(74) *Attorney, Agent, or Firm* — Knobbe, Martens, Olson & Bear LLP

(57) ABSTRACT

Enhancement mode III-nitride HEMT and method for manufacturing an enhancement mode III-nitride HEMT are disclosed. In one aspect, the method includes providing a substrate having a stack of layers on the substrate, each layer including a III-nitride material, and a passivation layer having high temperature silicon nitride overlying and in contact with an upper layer of the stack of III-nitride layers, wherein the HT silicon nitride is formed by MOCVD or LPCVD or any equivalent technique at a temperature higher than about 450° C. The method also includes forming a recessed gate region by removing the passivation layer only in the gate region, thereby exposing the underlying upper layer. The method also includes forming a p-doped GaN layer at least in the recessed gate region, thereby filling at least partially the recessed gate region, and forming a gate contact and source/drain contacts.

13 Claims, 3 Drawing Sheets

ENHANCEMENT MODE III-NITRIDE DEVICE AND METHOD FOR MANUFACTURING THEREOF

CROSS REFERENCE TO RELATED APPLICATIONS

This application is a divisional of U.S. patent application Ser. No. 13/706,133, filed Dec. 5, 2012, which claims priority under 35 U.S.C. §119(e) to U.S. Provisional Patent Application No. 61/569,078, filed Dec. 9, 2011, the contents of which are hereby incorporated by reference in their entireties.

BACKGROUND OF THE INVENTION

1. Field of the Invention

The disclosed technology relates to an enhancement mode III-nitride device and a method for manufacturing thereof.

2. Description of the Related Technology

AlGaN/GaN high electron mobility transistors (HEMTs) are now receiving great attention because of their potential applications to high-power and high-frequency devices.

Enhancement mode GaN HEMT devices can be realized by depletion of the two-dimensional electron gas (2DEG) using a p-type doped GaN or AlGaN layer above the channel. Typically, this layer is grown during the metal-organic chemical vapor deposition (MOCVD) process of the complete GaN/AlGaN composite stack for buffer, channel and barrier layers, with the p-GaN blanket on top of the AlGaN. However, further device fabrication requires the p-GaN layer to be selectively etched from the AlGaN barrier in all regions except the channel region.

The etching of p-GaN selective to AlGaN is both difficult and leaves the surface between gate and drain exposed to the plasma etch. This region is no longer passivated after this etch step, which makes it difficult to use high temperature dielectric deposition to passivate the surface. As a result, this device architecture is subject to drain lag. The term "drain-lag" is used to describe the slow transient response of the drain current when the drain-source voltage is pulsed.

SUMMARY OF CERTAIN INVENTIVE ASPECTS

In a first aspect, there is a method for manufacturing an enhancement mode III-nitride HEMT comprising: (a) providing a substrate (101) comprising a stack of layers on the substrate, each layer comprising a III-nitride material, and a passivation layer (301) comprising high temperature (HT) silicon nitride overlying and in contact with an upper layer (203, 204—not shown) of the stack of III-nitride layers, wherein the HT silicon nitride is formed by MOCVD or LPCVD or any equivalent technique at a temperature higher than about 450° C., particularly higher than about 550° C., particularly higher than 700° C., (b) forming a recessed gate region by removing substantially completely the passivation layer (301) selectively towards the underlying upper layer (203, 204) only in the gate region, thereby exposing the underlying upper layer, then (c) forming a p-GaN layer (302, 302') at least in the recessed gate region, thereby filling at least partially the recessed gate region, and (d) forming a gate contact in the gate region and source/drain contacts through the passivation layer.

In a second aspect, an enhancement mode III-nitride device (HEMT) is disclosed comprising: (a) a substrate (101) comprising a stack of layers on the substrate, each layer comprising a III-nitride material, and a passivation layer (301) comprising high temperature (HT) silicon nitride overlying and in contact with an upper layer (203, 204) of the stack of III-nitride layers, (b) a recessed gate region through the passivation layer exposing at its bottom the upper layer (203, 204) of the stack of III-nitride layers, (c) a p-doped GaN layer (302) filling at least partially the recessed gate region, wherein the p-doped GaN-comprising layer is overlying and in contact with the upper layer of the stack of III-nitride layers in the recessed gate region, and (d) source/drain contacts provided through the passivation layer, wherein the passivation layer (301) covers the upper layer (203, 204) of the stack of III-nitride layers everywhere except the recessed gate region and the source/drain contacts.

The passivation layer comprises high temperature (HT) silicon nitride, wherein HT silicon nitride is a material having distinctive properties according to its definition enclosed in the present description. After its formation on the substrate comprising the stack of III-nitride layers (e.g., in-situ) the passivation layer covers the whole active GaN device except the gate region and the source/drain contacts. An advantage of the device according to one inventive aspect is that the passivation layer comprising HT silicon nitride is preserved during the subsequent manufacturing process steps and in the final device and thereby permanently protects the upper surface of the III-nitride device. The later contributes directly to a better performance of the final device, more specifically to the low drain lag.

The source/drain contacts are etched through the passivation layer or alloyed through a thin layer of silicon nitride. During and after forming the gate contact and the source and drain contacts the passivation layer made of HT silicon nitride is protecting the upper surface of the stack of III-nitride layers everywhere except these contacts.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF CERTAIN ILLUSTRATIVE EMBODIMENTS

Figure 1:
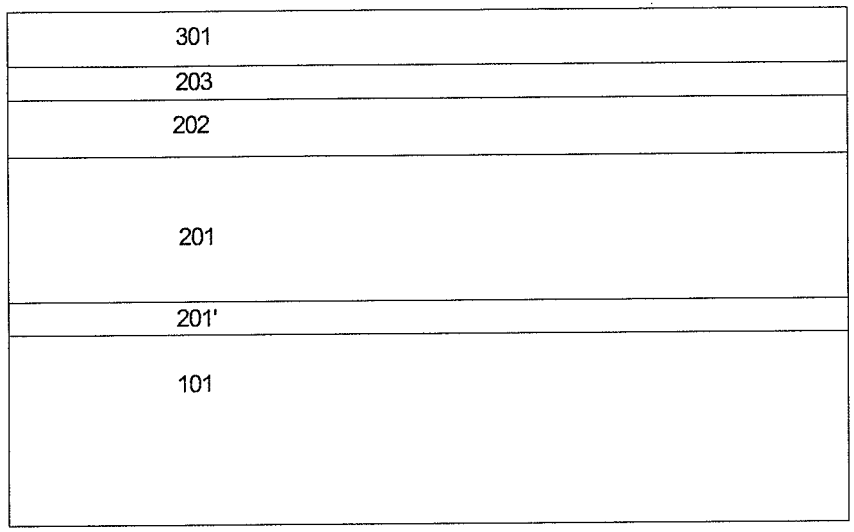
FIG. 1 illustrates schematically an embodiment of the e-mode HEMT, wherein: (101) substrate; a stack of III-nitride layers comprising (201') nucleation layer, (201) buffer layer, (202) channel layer, (203) barrier layer and (301) passivation layer.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Various embodiments disclose a method for manufacturing an enhancement mode (e-mode) III-nitride HEMT having better performance than the state of the art. In particular certain embodiments of the device have a better dispersion behavior and is less subjected to drain lag.

Enhancement mode III-nitride N HEMT devices can be realized by depletion the two-dimensional electron gas (2DEG) using a p-type doped GaN or AlGaN layer above the channel.

Typically, this layer is grown after the growth of the complete III-nitride stack (comprising buffer, channel and barrier layers), by forming a p-doped GaN blanket layer on top of the barrier layer (AlGaN).

In general, a p-doped GaN (p-GaN) layer atop the stack of III-nitride layers reduces the dispersion in the HEMTs. However, the device fabrication for enhancement mode devices with low $R_{on}$ requires the p-GaN layer to be selectively removed (etched) from the upper layer of the stack of III-nitride layers (e.g. from the AlGaN barrier) in all regions except the channel region.

The etching of p-GaN selective to the barrier layer (AlGaN) is both difficult and detrimental for the performance of the device since it leaves the surface between gate and drain exposed to the plasma etch. This region is no longer passivated after exposing it to plasma etch. Performing a healing treatment at high temperatures or using high temperature dielectric deposition to passivate the surface is not optimal because of the instable nature of the exposed surface. As a result, this device architecture has a poor interface between the barrier layer (AlGaN) and the dielectric on top of it and it is therefore sensitive to drain lag.

In a first aspect present application discloses a method for manufacturing an enhancement mode III-nitride HEMT comprising:

a. providing a substrate (101) comprising a stack of layers on the substrate, each layer comprising a III-nitride material, and a passivation layer (301) comprising high temperature (HT) silicon nitride overlying and in contact with an upper layer (203, 204—not shown) of the stack of III-nitride layers, wherein the HT silicon nitride is formed by MOCVD or LPCVD or any equivalent technique at a temperature higher than about 450° C., particularly higher than about 550° C., more particularly higher than 700° C., b. forming a recessed gate region by removing substantially completely the passivation layer (301) selectively towards the underlying upper layer (203, 204) only in the gate region, thereby exposing the underlying upper layer, then c. forming a p-GaN layer (302, 302') at least in the recessed gate region, thereby filling at least partially the recessed gate region, and d. forming a gate contact in the gate region and source/drain contacts through the passivation layer.

Figure 2:
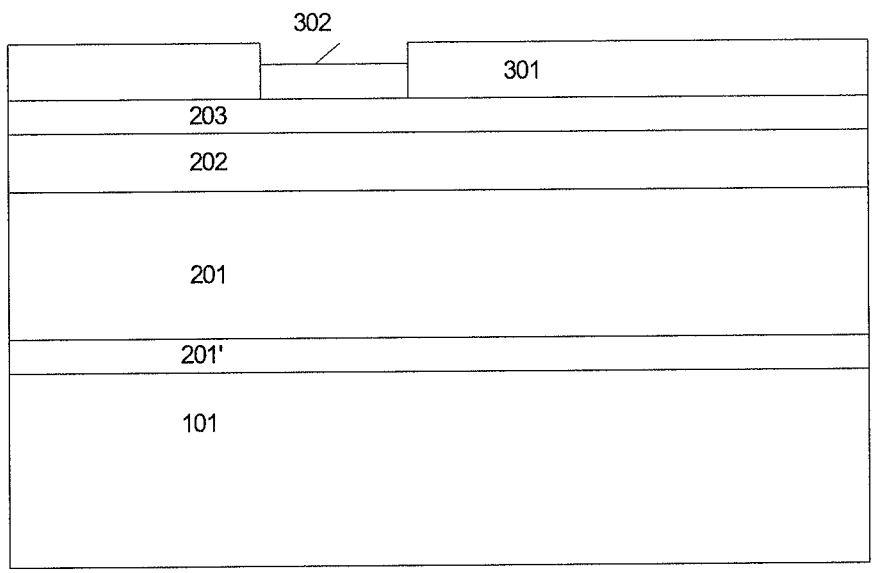
FIG. 2 shows schematically a p-GaN layer (302) selectively grown after recessing the passivation layer (301) in the gate region according to one embodiment.
Figure 3:
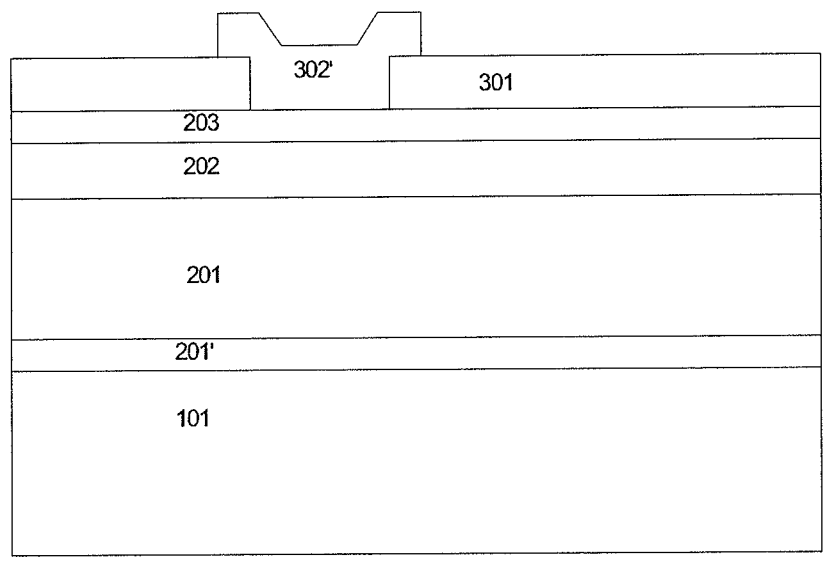
FIG. 3 shows schematically a p-GaN layer (302') remaining in the gate region after patterning a p-GaN layer grown non-selectively in the gate region and on top of the passivation layer (301).

The numbers between brackets make reference to FIGS. 1 to 3 which illustrate schematically the III-nitride device according to one embodiment.

In the present disclosure, the term 'III-nitride' denotes a semiconductor material that comprises at least one element from Group III of the Periodic Table of Elements and nitrogen. Examples of III-nitride compound semiconductors that can be used include, but are not limited to GaN, AlN, InGaN, InAlN, AlGaN, mixtures and combinations thereof.

In certain embodiments of the different aspects of the disclosure the term "substrate" may include any underlying material or materials that may be used, or upon which a device, a circuit or an epitaxial layer may be formed. In other alternative embodiments, this "substrate" may include a semiconductor substrate such as a doped silicon, a gallium arsenide (GaAs), a gallium arsenide phosphide (GaAsP), an indium phosphide (InP), a germanium (Ge), or a silicon germanium (SiGe) substrate. The "substrate" may include for example, a dielectric layer such as a $SiO_2$ or a $Si_3N_4$ layer in addition to a semiconductor substrate portion. Thus, the term substrate also includes silicon-on-glass, silicon-on sapphire substrates. Also, the "substrate" may be any other base on which a layer is formed, for example a glass or metal layer.

In one embodiment, the substrate may comprise silicon, silicon carbide, sapphire or III-nitride materials such as GaN. More preferably the substrate is made of silicon. More preferably the substrate is made of mono-crystalline silicon having a (111) or an equivalent crystalline orientation. In specific embodiments of the disclosure the substrate is a silicon wafer having (111) crystalline orientation and a diameter of about 150 mm, 200 mm or 300 mm. Advantageously, using a silicon wafer enables co-integration with silicon based CMOS.

A stack of layers each layer comprising a III-nitride material, hereinafter referred to as "a stack of III-nitride layers" is formed by epitaxial techniques on the substrate. The stack of III-nitride layers comprises in general a buffer layer (201), a channel layer (202) and a barrier layer (203), which are also referred to as the active layers of the HEMT device. Alternatively, the channel layer can be the upper part (top) of a thick buffer layer (201). Each of the active layers can be a multi-layer or a layer having a graded composition.

The active layers of the HEMT can be fabricated by metal-organic chemical vapor deposition (MOCVD) or by molecular beam epitaxy (MBE), in which the device layers are built up by deposition of molecules in a vacuum.

The HEMT growth typically starts with a buffer layer (201) to achieve a high quality device. In case the substrate material is different from the active material, this buffer layer also accommodates the difference in lattice constant.

In the context of the present disclosure the thickness of the buffer layer (201) may, for example, be between about 200 nm and 10 µm, particularly between about 1 µm and 3 µm. Optionally, additional buffer layers (201'), e.g. nucleation layers and/or interlayers such as AlGaN, AlN or GaN interlayers, may be provided to overcome the thermal expansion and lattice mismatch between the substrate and the active layers.

Next, the channel layer (202) may comprise GaN, GaAs or InGaAs. The thickness of the channel layer may, for example, be between about 5 nm and 200 nm, particularly between about 50 nm and 200 nm. Next, the barrier layer (203) may, for example, comprise AlGaN, AlGaAs or InAlAs. The thickness of the barrier layer may, for example, be between about 1 and 50 nm, particularly between about 5 nm and 30 nm. Alternatively, AlGaAs/GaAs transistor can be fabricated, without an explicit channel layer. Additionally, a cap layer (204, not shown) comprising an III-nitride material can be formed by epitaxial growth on the barrier layer (203). Such additional cap layer may comprise GaN and have a thickness between about 1 nm and 10 nm.

In a next step, a passivation layer (301) comprising silicon nitride is grown in-situ (i.e. under controlled atmosphere, without "vacuum break" between the steps of forming the III-nitride layers and the step of forming the passivation layer) such that it is overlying and in contact with an upper layer of the stack of layers. The upper layer can be the barrier layer (203) or the additional cap layer (204) or any other III-nitride layer part of the stack of III-nitride layers used to form the HEMT. The passivation layer (301) is deposited in-situ with the stack of layers, i.e. in the same process step by MOCVD or MBE or an equivalent technique. In a specific embodiment the passivation layer (301) is deposited in-situ with the stack of layers by MOCVD at a temperature between about 900° C. and 1250° C., particularly at about 1100° C.

Alternatively the passivation layer can be grown ex-situ by low pressure chemical vapor deposition (LPCVD) at a temperature higher than about 450° C., particularly higher than about 550° C., more particularly higher than about 700° C.

In certain embodiments of the different aspects of the disclosure, the passivation layer comprises silicon nitride ($Si_3N_4$). In some embodiments the first passivation layer may further comprise Al. The passivation layer can be made of a single layer with homogeneous composition, a single layer having a gradual composition or it can comprise a plurality of layers. In one embodiment, the passivation layer may comprise or consist of silicon nitride ($Si_3N_4$). The thickness of the passivation layer may be between about 5 nm up to about 300 nm. In certain embodiments of the disclosure a thin layer of in-situ HT silicon nitride is deposited first (e.g. about 5 nm to 20 nm by MOCVD) followed by a thicker layer of HT silicon nitride ex-situ (e.g. about 100 nm to 300 nm by LPCVD). In a particular embodiment the thickness of the in-situ passivation layer is about 120 nm.

The passivation layer (301) is deposited in by MOCVD or LPCVD or any equivalent technique at a temperature higher than about 450° C., particularly higher than about 550° C., more particularly higher than about 700° C. Throughout this disclosure the silicon nitride deposited at a temperature higher than about 450° C., by LPCVD (batch process or single wafer process, i.e. SINgen™) or MOCVD or any equivalent technique will be referred to as "high temperature (HT) silicon nitride" or "LPCVD silicon nitride". The HT silicon nitride may be deposited at a temperature between about 550° C. and 800° C., particularly between about 600° C. and 800° C.

The HT silicon nitride layer deposited by MOCVD or LPCVD is a better passivation layer than a PECVD (plasma enhanced chemical vapor deposition) silicon nitride. HT silicon nitride is characterized by a lower H-content, about 3-8% than that of PECVD silicon nitride (about 10-40%). Also HT silicon nitride has a higher density: about 2.9-3.1 $g/cm^3$ versus 2.3-3.1 $g/cm^3$ for PECVD silicon nitride, and a lower pinhole density.

In general, a PECVD silicon nitride layer as used in the art is deposited at a temperature of about 300° C.-400° C. However, when subjected to a higher temperature e.g. the temperature of ohmic alloy formation in a subsequent step such a PECVD silicon nitride layer shows blisters and cracks or delamination compromising the device yield. The HT silicon nitride does not have these drawbacks.

At step (b) a recessed gate region is formed by removing substantially completely the passivation layer selectively towards the underlying upper layer only in the gate region. In a next step (c) a p-doped GaN layer is formed in the recessed gate region, filling at least partially (in depth) the recessed gate region. Thereby the removal (etch) of the p-GaN layer entirely from the AlGaN barrier (which left the surface exposed) is avoided.

Throughout the disclosure the "p-doped GaN" layer is a layer comprising GaN and p-type dopants. The p-doped GaN layer may comprise small amounts of Al with a uniform concentration of Al or a gradual decreasing concentration of Al, from the interface with the stack of III-nitride layers towards the its top surface underlying the gate. Preferably the p-doped GaN layer consists of GaN and p-type dopants.

In specific embodiments selectively etching the passivation layer (301, HT silicon nitride) towards the upper layer (e.g. the barrier layer 203 or the cap layer 204) of the stack of III-nitride layers is performed by dry-etch with $SF_6$-comprising plasma. Preferably the dry-etch process is performed without DC bias to prevent 2-DEG damage.

In certain embodiments of the disclosure a p-doped GaN (p-GaN) layer is formed as a monocrystalline material by selective epitaxial growth only in the recessed gate region on the exposed barrier layer, while no nucleation takes place on the passivation layer. The selective epitaxial growth is performed at a temperature higher than the non-selective deposition. The p-GaN has a thickness such that it is filling at least partially the recessed gate region, e.g., between about 5 nm and 300 nm.

In a specific embodiment a p-GaN layer with a thickness of about 60 nm and a doping concentration of about $3 \times 10^{17} cm^{-3}$ was grown following by metal gate deposition and patterning forming thereby a Schottky contact gate. In a specific embodiment the metal gate consists of TiN.

Without wishing to be bound by theory it is observed that when forming thin p-GaN layers a Schottky contact is formed, while for thicker layers an ohmic contact can be formed. For the doping concentration of the specific embodiment above, the threshold value between Schottky and ohmic contact is about 70 nm.

In alternative embodiments, the p-GaN layer is formed by non-selective deposition both in the recessed gate region and on the passivation layer. The non-selective deposition is performed at a temperature lower than the selective epitaxial growth allowing nucleation of the p-GaN material on the HT silicon nitride of the passivation layer.

The p-GaN layer formed by non-selective deposition on the passivation layer is a polycrystalline material. Advantageously, the polycrystalline p-GaN material can be selectively removed with respect to the mono-crystalline p-GaN material formed in the gate recessed region and the passivation layer underneath.

The p-GaN layer is subsequently removed selectively from the passivation layer in a patterning step. The removal can be performed by a dry-etch or wet etch process.

In different embodiments of the disclosure the p-GaN layer is formed by introducing precursors containing p-dopants during its formation. Non limitative examples of p-dopants suitable to be introduced during the growth are Mg, Be, Zn or any combinations thereof. The doping concentration is higher than about $1 \times 10^{17}$ cm$^{-3}$. In a particular example the dopant is Mg, the precursor is cyclopentadienyl magnesium (Cp2Mg), and the doping concentration of the p-GaN layer is about $3 \times 10^{17}$ cm$^{-3}$.

In one embodiment, an enhancement mode III-nitride device (HEMT) is disclosed comprising:
- a substrate (101) comprising a stack of layers on the substrate, each layer comprising a III-nitride material, and a passivation layer (301) comprising high temperature (HT) silicon nitride overlying and in contact with an upper layer (203, 204) of the stack of III-nitride layers,
- a recessed gate region through the passivation layer exposing at its bottom the upper layer (203, 204) of the stack of III-nitride layers,
- a p-doped GaN layer (302) filling at least partially the recessed gate region, wherein the p-doped GaN-comprising layer is overlying and in contact with the upper layer of the stack of III-nitride layers in the recessed gate region, and
- source/drain contacts through the passivation layer
wherein the passivation layer (301) covers the upper layer (203, 204) of the stack of III-nitride layers everywhere except the recessed gate region and the source/drain contacts.

The passivation layer comprises high temperature (HT) silicon nitride, wherein HT silicon nitride is a material having distinctive properties according to its definition enclosed in the present description. After its formation on the substrate comprising the stack of III-nitride layers (preferably in-situ) the passivation layer covers the whole active GaN device except the gate region and the source/drain contacts. An advantage of the device according to one embodiment is that the passivation layer comprising HT silicon nitride is preserved during the subsequent manufacturing process steps and in the final device and thereby permanently protects the upper surface of the III-nitride device. The later contributes directly to a better performance of the final device, more specifically to the low drain lag.

An example of a passivated substrate for manufacturing the enhancement mode III-nitride (GaN) transistor is illustrated schematically in FIG. 1. An opening (gate recess) is patterned through the in-situ passivation layer (301) stopping on the underlying barrier layer (203) in the gate region. Subsequently the p-GaN layer is grown either selectively only in the gate region (302, FIG. 2) or non-selectively. In the latter case, a masking step is performed to pattern the p-GaN layer and remove it selectively to the underlying passivation layer as shown schematically in (302', FIG. 3).

The non-selective p-GaN grows monocrystalline in the gate region and polycrystalline on top of the passivation layer. Advantageously the growth rate is more uniform than in the case of selective growths not affected by loading effects. It is an advantage of the method that the patterning of the p-GaN layer grown non-selective does not affect the AlGaN (barrier) surface which remains protected by the passivation layer. Hence the method according to one embodiment avoids exposing the AlGaN barrier layer in all regions except the gate/channel region which is known to lead to poor performance.

Further the e-mode HEMT device may comprise a metal gate overlying and in contact with the p-GaN layer forming a Schottky contact or an ohmic contact depending on the thickness and the doping concentration of the p-GaN layer.

Finally, source/drain aligned contacts are etched through the passivation layer or alloyed through a thin layer of silicon nitride. During and after forming the gate contact and the source and drain contacts the passivation layer made of HT silicon nitride is protecting the upper surface of the stack of III-nitride layers everywhere except these contacts.

Figure 4:
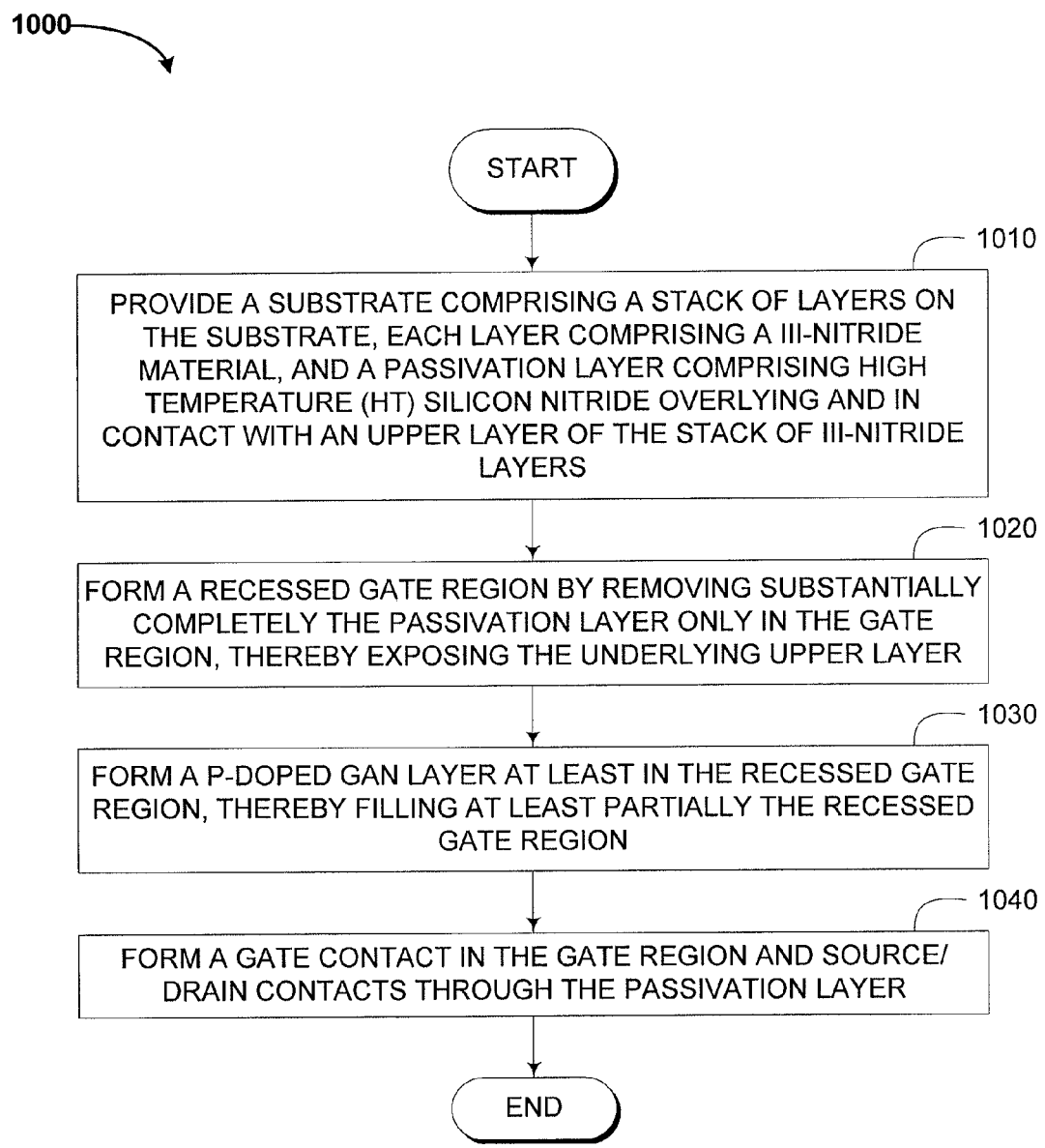
FIG. 4 shows a flowchart of one embodiment of a method of manufacturing an enhancement mode III-nitride high electron mobility transistor (HEMT).

FIG. 4 shows a flowchart of one embodiment of a method of manufacturing an enhancement mode III-nitride high electron mobility transistor (HEMT). The method 1100 includes, at block 1010, providing a substrate comprising a stack of layers on the substrate, each layer comprising a III-nitride material, and a passivation layer comprising high temperature (HT) silicon nitride overlying and in contact with an upper layer of the stack of III-nitride layers. The HT silicon nitride may be formed by metal-organic chemical vapor deposition (MOCVD) or low pressure chemical vapor deposition (LPCVD) or any equivalent technique. The HT silicon nitride may be formed at a temperature higher than about 450° C. Moving to block 1020, the method includes forming a recessed gate region by removing substantially completely the passivation layer only in the gate region, thereby exposing the underlying upper layer. Next at block 1030, the method includes forming a p-doped GaN layer at least in the recessed gate region, thereby filling at least partially the recessed gate region. Moving to block 1040, the method includes forming a gate contact in the gate region and source/drain contacts through the passivation layer.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing an enhancement mode III-nitride high electron mobility transistor (HEMT), the method comprising:
   providing a substrate comprising a stack of III-nitride layers on the substrate, each layer comprising a III-nitride material, and a passivation layer comprising high temperature (HT) silicon nitride overlying and in contact with an upper layer of the stack of III-nitride layers, wherein the HT silicon nitride is formed by metal-organic chemical vapor deposition (MOCVD) or low pressure chemical vapor deposition (LPCVD) at a temperature higher than about 450° C., wherein the passivation layer is formed in-situ with the stack of III-nitride layers;

forming a recessed gate region by removing substantially completely the passivation layer only from a gate region, thereby exposing the underlying upper layer, forming a p-doped GaN layer at least in the recessed gate region, thereby filling at least partially the recessed gate region; and forming a gate contact in the gate region and source/drain contacts through the passivation layer.

2. The method according to claim 1, wherein the p-doped GaN layer is formed by selective epitaxial growth only in the recessed gate region.

3. The method according to claim 1, wherein the thickness of the passivation layer is between about 5 nm and 300 nm.

4. The method according to claim 1, wherein the thickness of the p-GaN layer in the recessed gate region is between about 5 nm and 300 nm.

5. The method according to claim 1, wherein a doping concentration of the p-doped GaN layer is higher than about $1 \times 10^{17}$ cm-3.

6. The method according to claim 1, wherein the p-doped GaN layer is doped with a dopant selected from the group consisting of Mg, Be, Zn and combinations thereof.

7. The method according to claim 1, wherein the HT silicon nitride is formed at a temperature higher than about 550° C.

8. The method according to claim 7, wherein the HT silicon nitride is formed at a temperature higher than about 700° C.

9. An enhancement mode III-nitride high electron mobility transistor (HEMT) as manufactured by the method according to claim 1.

10. The method according to claim 1, wherein the stack of III-nitride layers comprises:

a buffer layer formed on the substrate;

a channel layer formed on the buffer layer and formed of a material selected from the group consisting of GaN, GaAs and InGaAs; and a barrier formed on the channel layer and formed of a material selected from the group consisting of AlGaN, AlGaAs and InAlAs.

11. The method according to claim 1, wherein the HT silicon nitride is formed using metal-organic chemical vapor deposition (MOCVD).

12. The method according to claim 11, wherein the HT silicon nitride is formed at a temperature between about 900° C. and about 1250° C.

13. The method according to claim 12, wherein the HT silicon nitride has a hydrogen content of about 3-8% and a density of about 2.9-3.1 g/cm$^3$.

* * * * *